United States Patent
Kannami et al.

(10) Patent No.: US 11,424,099 B2
(45) Date of Patent: Aug. 23, 2022

(54) CHARGED PARTICLE BEAM DEVICE

(71) Applicant: Hitachi High-Tech Corporation, Tokyo (JP)

(72) Inventors: Hiroki Kannami, Tokyo (JP); Hironori Itabashi, Tokyo (JP); Ichiro Fujimura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 88 days.

(21) Appl. No.: 16/771,121

(22) PCT Filed: Dec. 21, 2017

(86) PCT No.: PCT/JP2017/045921
§ 371 (c)(1),
(2) Date: Jun. 9, 2020

(87) PCT Pub. No.: WO2019/123604
PCT Pub. Date: Jun. 27, 2019

(65) Prior Publication Data
US 2021/0175047 A1    Jun. 10, 2021

(51) Int. Cl.
*H01J 37/22*    (2006.01)
*H01J 37/28*    (2006.01)
*H01J 37/147*   (2006.01)

(52) U.S. Cl.
CPC ........ *H01J 37/222* (2013.01); *H01J 37/1474* (2013.01); *H01J 37/28* (2013.01); *H01J 2237/004* (2013.01)

(58) Field of Classification Search
CPC .... H01J 37/222; H01J 37/28; H01J 2237/004; H01J 2237/0048
See application file for complete search history.

(56) References Cited

U.S. PATENT DOCUMENTS

| 2008/0277583 A1 | 11/2008 | Yano et al. |
| 2012/0153145 A1 | 6/2012 | Cheng et al. |
| 2014/0097342 A1 | 4/2014 | Tsuno et al. |

FOREIGN PATENT DOCUMENTS

| JP | 2008-76070 A | 4/2008 |
| JP | 5055015 B2 | 8/2012 |

(Continued)

OTHER PUBLICATIONS

International Search Report (PCT/ISA/210) issued in PCT Application No. PCT/JP2017/045921 dated Mar. 13, 2018 with English translation (three (3) pages).

(Continued)

*Primary Examiner* — Eliza W Osenbaugh-Stewart
(74) *Attorney, Agent, or Firm* — Crowell & Moring LLP

(57) ABSTRACT

In order to control a charge amount on a sample surface to a desired value before calculating a frame integration image, the invention provides a charged particle beam device including: a charged particle beam source configured to irradiate a sample with a charged particle beam; a deflector configured to scan an observation region of the sample with the charged particle beam; a detector configured to detect a charged particle emitted from the sample due to scanning with the charged particle beam; an image generation unit configured to generate a frame image of the observation region based on an observation signal output from the detector; and a scanning suspension time setting unit configured to set a scanning suspension time, which is a time during which scanning of the observation region with the charged particle beam is suspended after a frame image is generated, in which the image generation unit calculates a frame integration image by integrating frame images generated with the scanning suspension time interposed.

10 Claims, 12 Drawing Sheets

(56) References Cited

FOREIGN PATENT DOCUMENTS

| | | | |
|---|---|---|---|
| JP | 2012-252913 A | 12/2012 | |
| JP | 2015-43334 A | 3/2015 | |

OTHER PUBLICATIONS

Japanese-language Written Opinion (PCT/ISA/237) issued in PCT Application No. PCT/JP2017/045921 dated Mar. 13, 2018 (four (4) pages).

[FIG. 1]
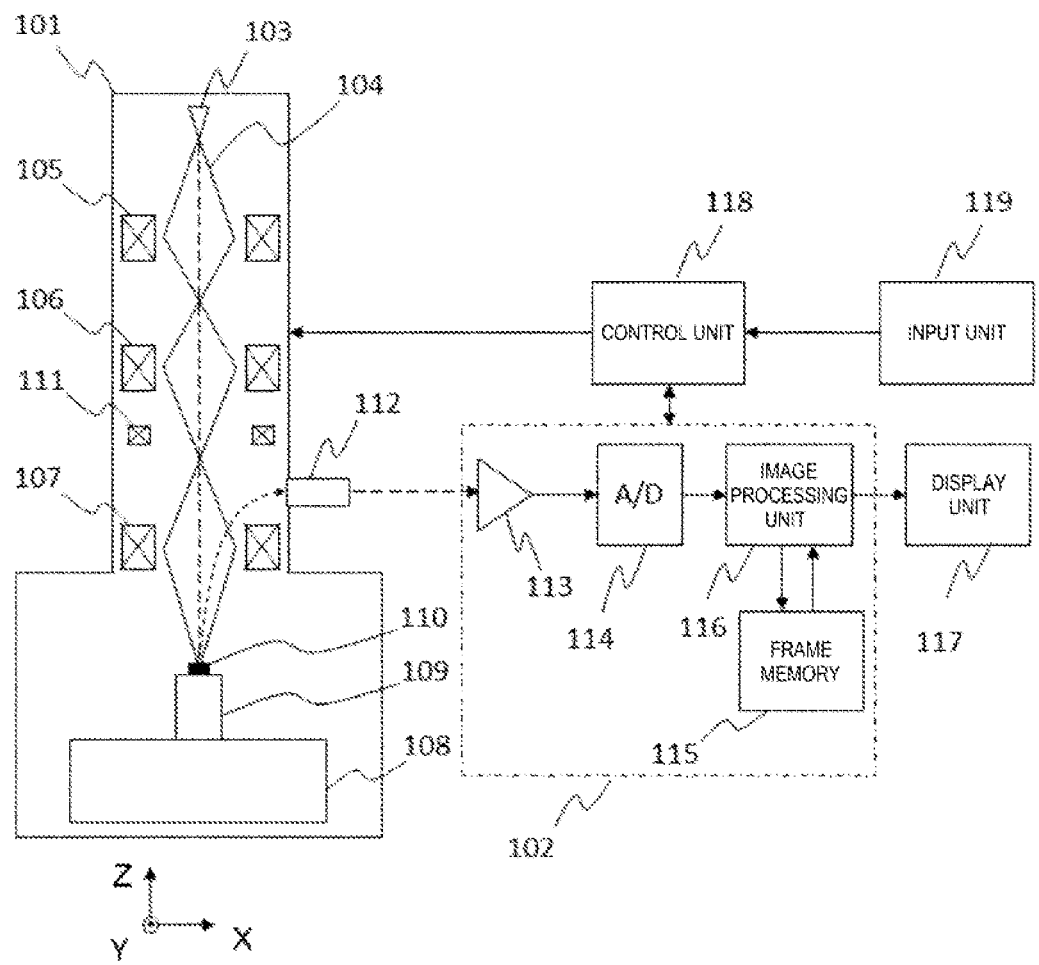

[FIG. 3]
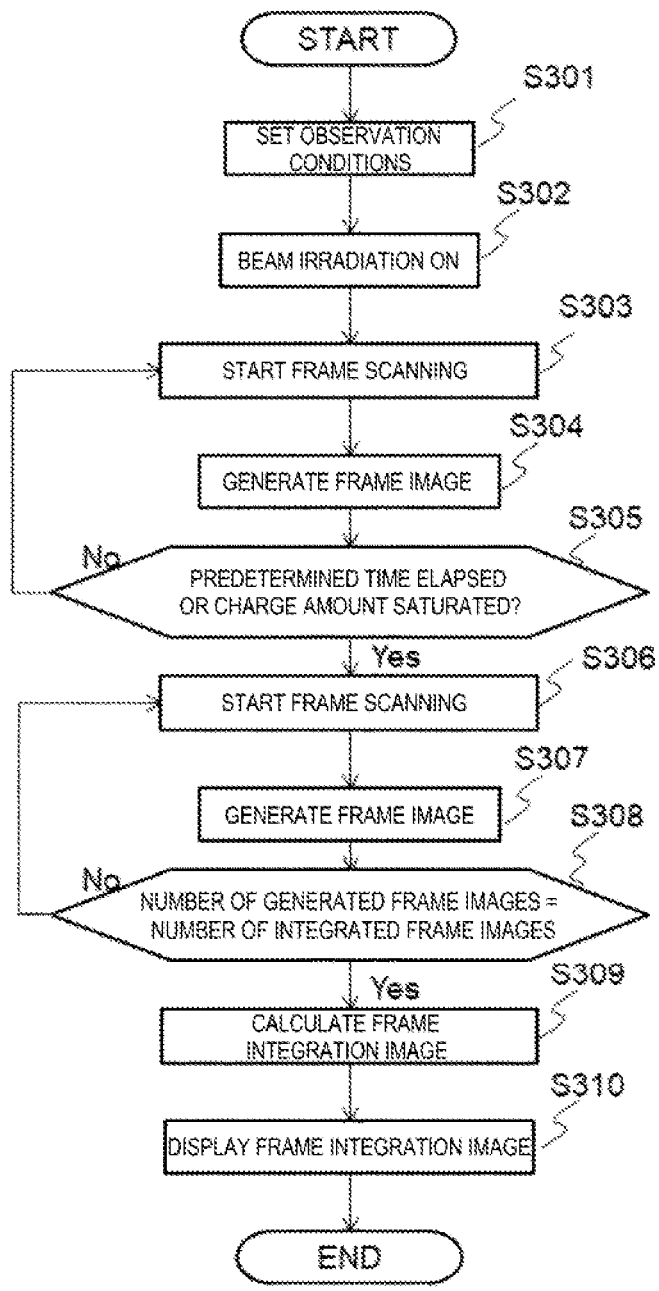

[FIG. 4]
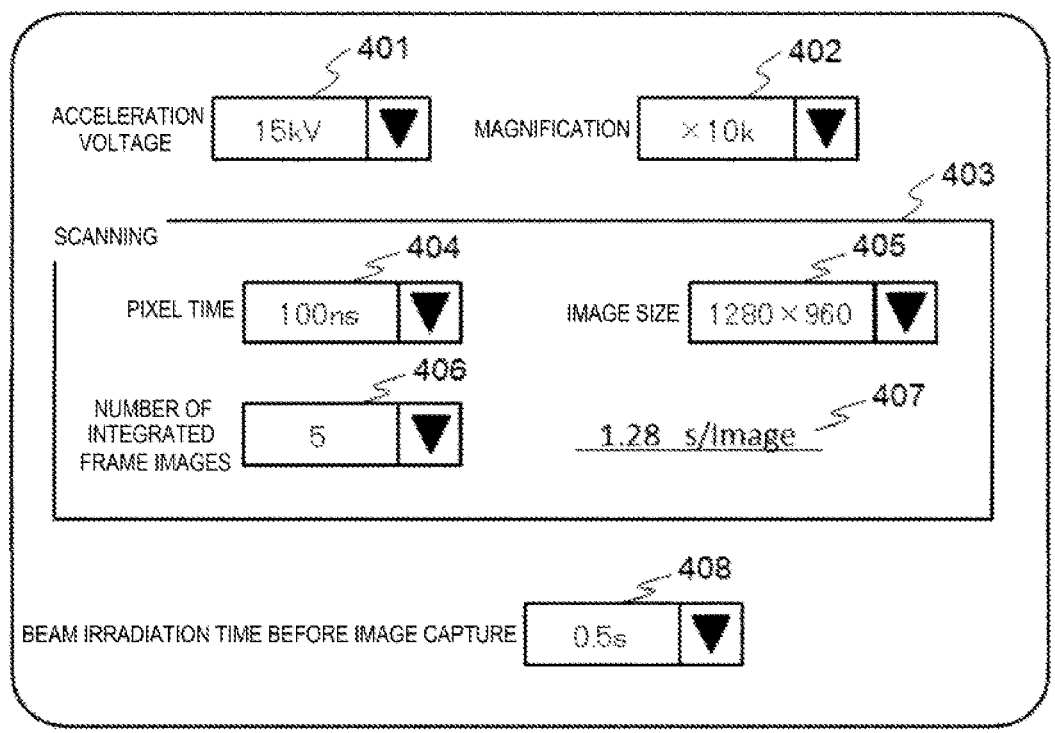

[FIG. 5]
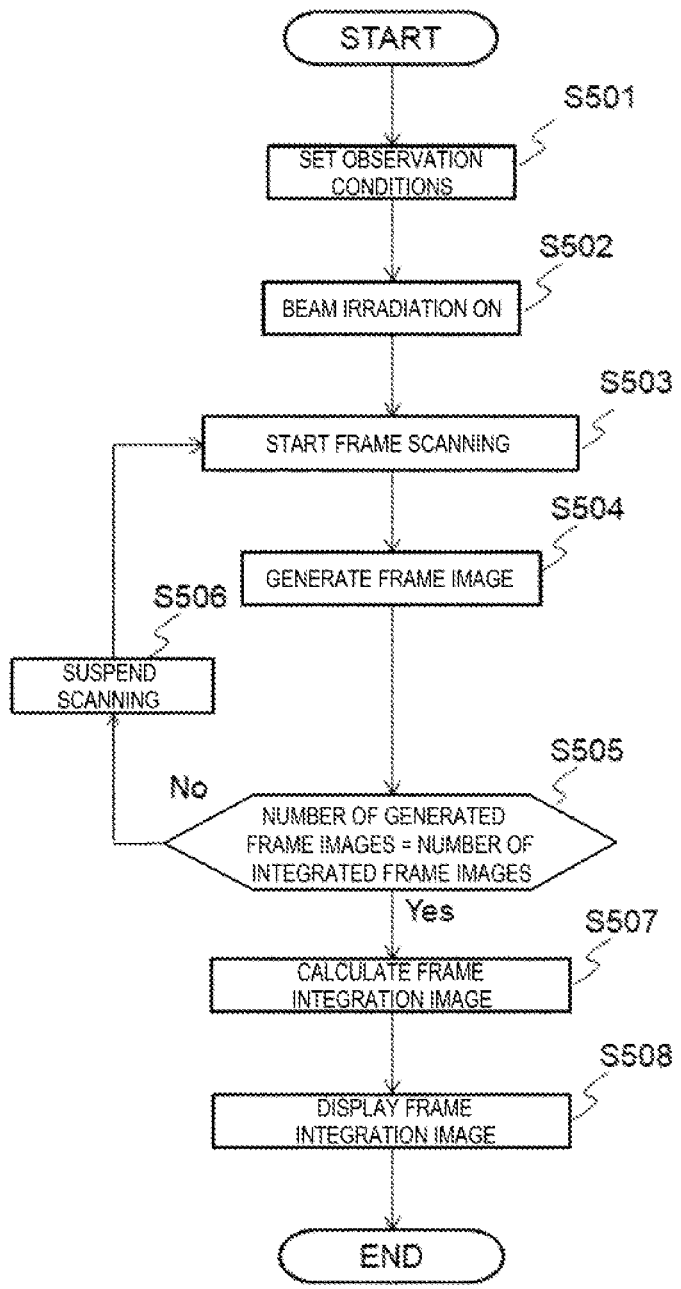

[FIG. 6]
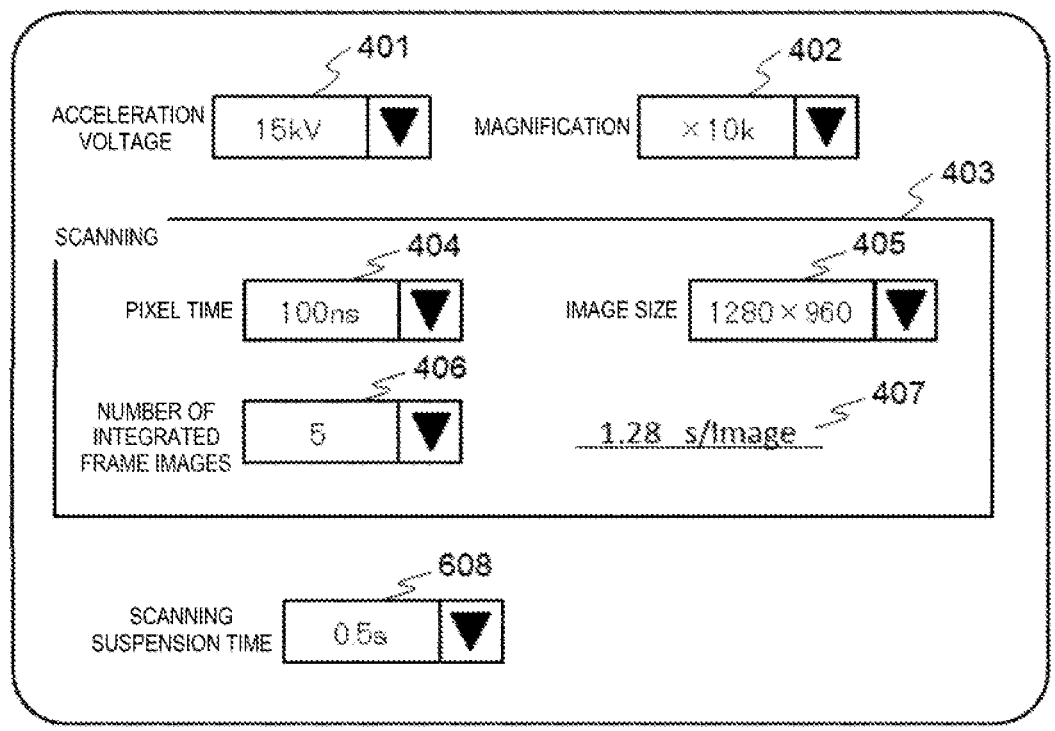

[FIG. 8]
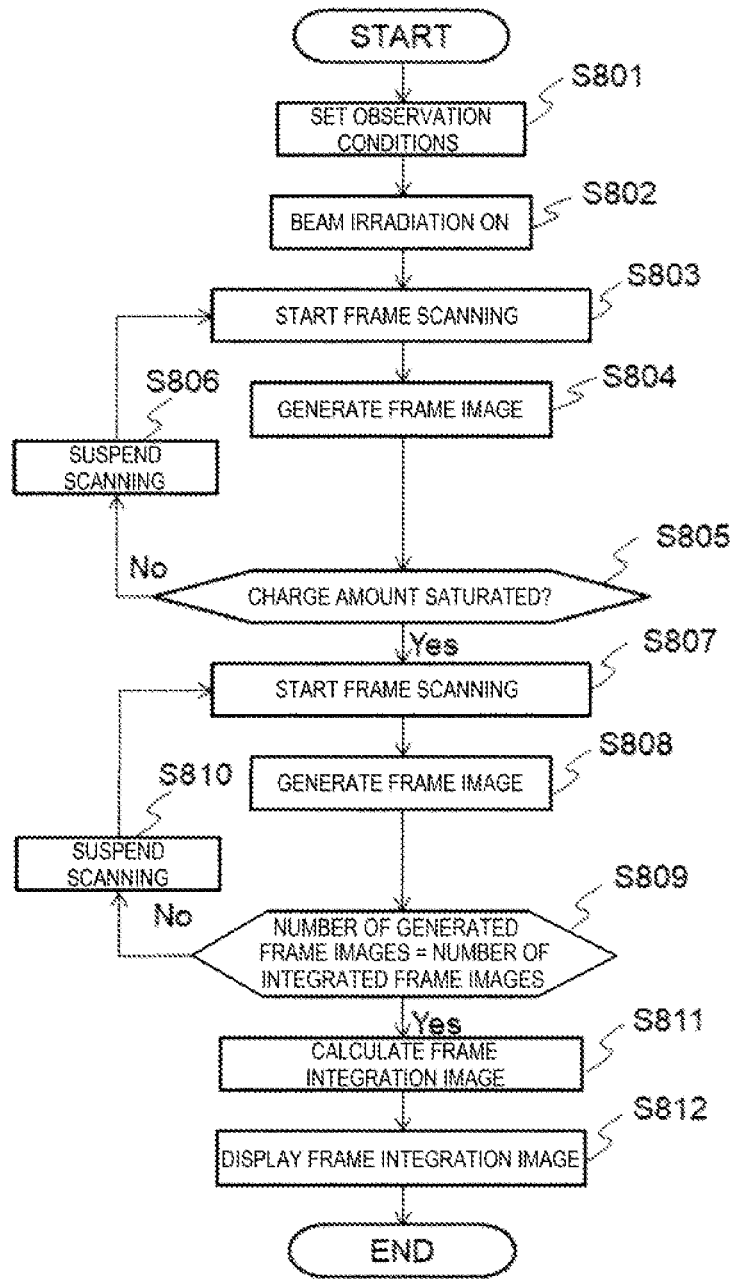

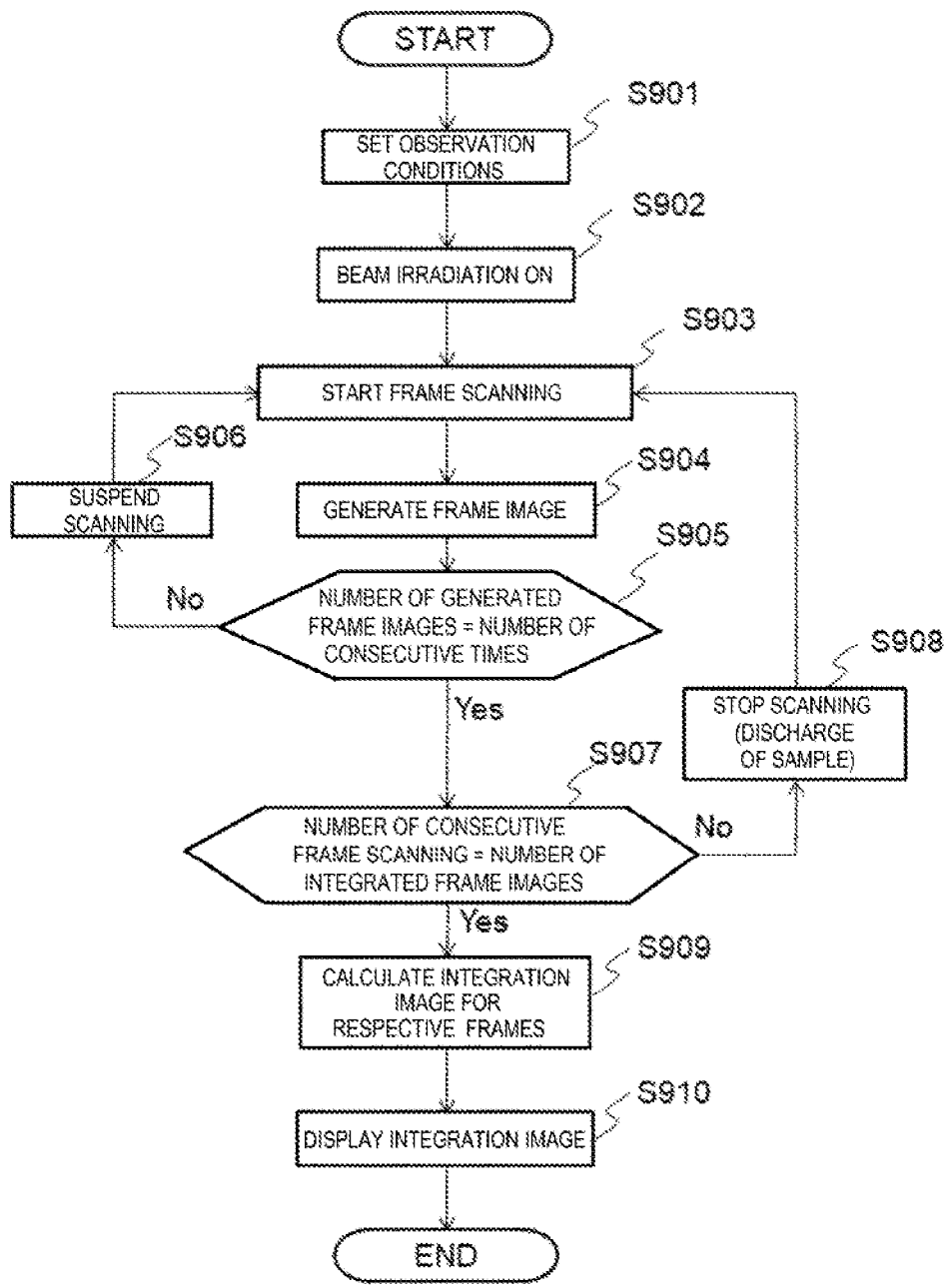
[FIG. 9]

[FIG. 10]
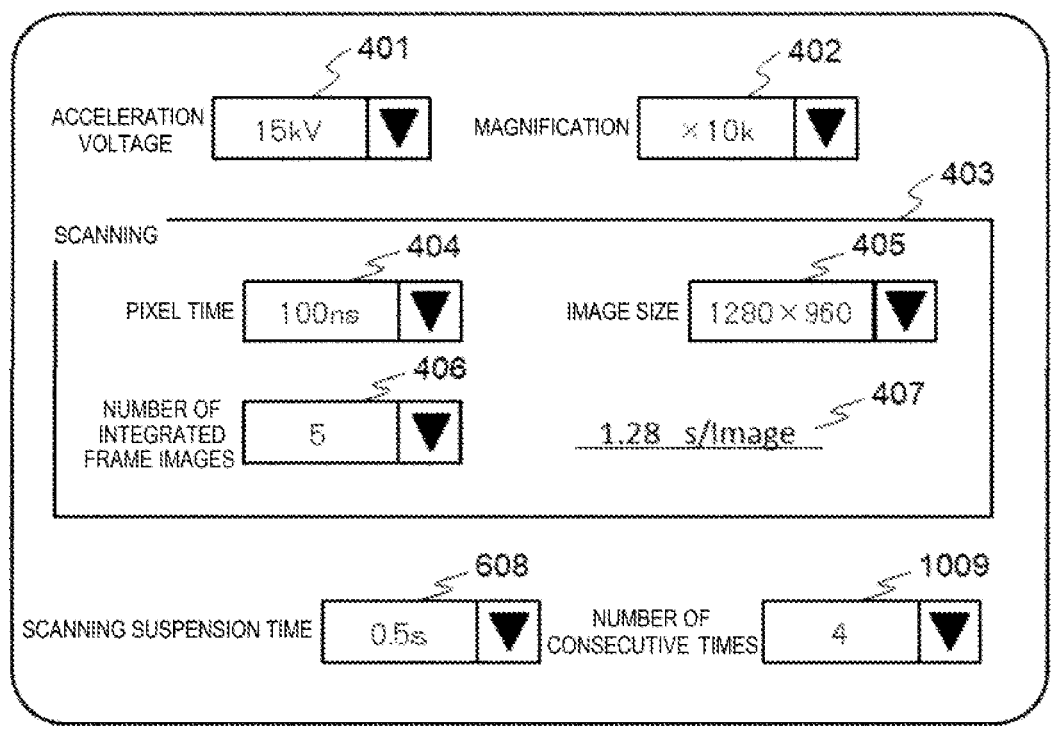

[FIG. 11]
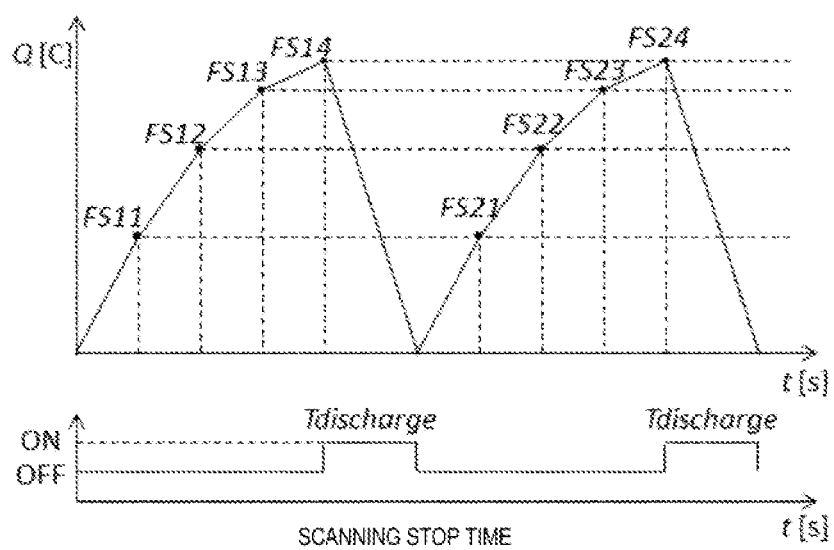

[FIG. 12]
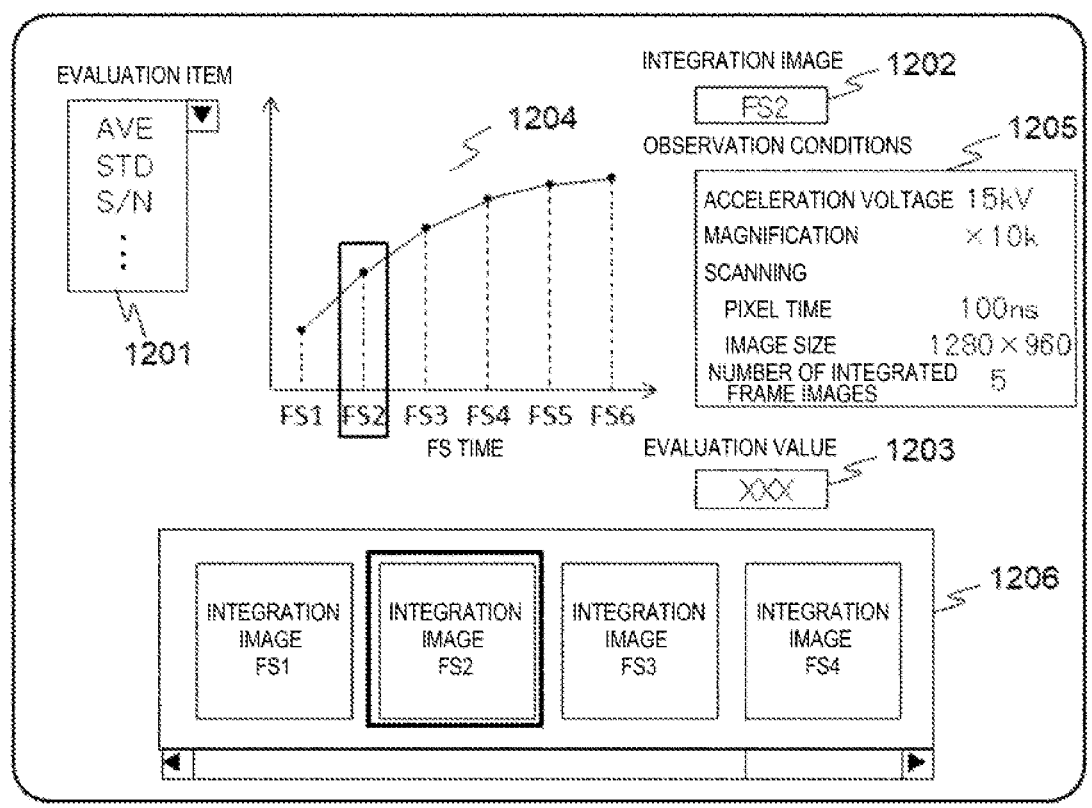

CHARGED PARTICLE BEAM DEVICE

TECHNICAL FIELD

The present invention relates to a charged particle beam device, and more particularly to a technique for controlling a charge amount on a sample surface irradiated with a charged particle beam.

BACKGROUND ART

A charged particle beam device is a device that irradiates a sample with a charged particle beam such as an electron beam and detects charged particles emitted from the sample, thereby forming an image for observing the sample. In order to form an image suitable for observation, it is necessary to reduce an influence of charging on a sample surface due to irradiation of the charged particle beam. PTL 1 discloses that a boosting electrode and a new light source are provided, and a voltage of the boosting electrode is controlled and irradiation is performed with ultraviolet light or an electron beam from the light source, so that an influence of charging on a sample surface is reduced.

CITATION LIST

Patent Literature

PTL 1: Japanese Patent No. 5055015

SUMMARY OF INVENTION

Technical Problem

However, in PTL 1, it is necessary to add new hardware such as the boosting electrode and the light source, and although the influence of charging can be reduced, no consideration is given to controlling a charge amount on the sample surface to a desired value. Since states on the sample surface are various and the charge amount suitable for observation differs for each sample, it is important to control the charge amount according to the sample. In particular, when calculating a frame integration image that is an image in which S/N is improved by integrating a plurality of frame images, control of the charge amount on the sample surface becomes even more important.

Therefore, an object of the invention is to provide a charged particle beam device capable of controlling a charge amount on a sample surface to a desired value before calculating a frame integration image.

Solution to Problem

In order to achieve the above object, the invention calculates a frame integration image using a plurality of frame images which is generated while scanning a predetermined region of a sample with a charged particle beam and suspending the scanning repeatedly.

More specifically, the invention provides a charged particle beam device including: a charged particle beam source configured to irradiate a sample with a charged particle beam; a deflector configured to scan an observation region of the sample with the charged particle beam; a detector configured to detect a charged particle emitted from the sample due to scanning with the charged particle beam; an image generation unit configured to generate a frame image of the observation region based on an observation signal output from the detector; and a scanning suspension time setting unit configured to set a scanning suspension time, which is a time during which scanning of the observation region with the charged particle beam is suspended after a frame image is generated, in which the image generation unit calculates a frame integration image by integrating frame images generated with the scanning suspension time interposed.

According to the invention, a generation of a frame image is started after a predetermined time elapses from a start of irradiation of a sample with a charged particle beam.

More specifically, the invention provides a charged particle beam device including: a charged particle beam source configured to generate a charged particle beam; a deflector configured to scan an observation region of a sample with the charged particle beam; a detector configured to detect a charged particle emitted from the sample due to scanning with the charged particle beam; an image generation unit configured to generate a frame image of the observation region based on an observation signal output from the detector; and a time setting unit configured to set a predetermined time, in which the image generation unit calculates a frame integration image by integrating frame images generated after the predetermined time elapsed from a start of the scanning with the charged particle beam.

Advantageous Effect

According to the invention, it is possible to provide a charged particle beam device capable of controlling a charge amount on a sample surface to a desired value before calculating a frame integration image.

BRIEF DESCRIPTION OF DRAWINGS

FIG. 1 is a diagram illustrating an overall configuration of a charged particle beam device according to a first embodiment.

FIG. 3 is a diagram illustrating a flow of a processing according to the first embodiment.

FIG. 4 is a diagram illustrating an example of a setting screen according to the first embodiment.

FIG. 5 is a diagram illustrating a flow of a processing according to a second embodiment.

FIG. 6 is a diagram illustrating an example of a setting screen according to the second embodiment.

FIG. 8 is a diagram illustrating a flow of a processing according to a third embodiment.

FIG. 9 is a diagram illustrating a flow of a processing according to a fourth embodiment.

FIG. 10 is a diagram illustrating an example of a setting screen according to the fourth embodiment.

FIG. 11 is a diagram illustrating a change in the charge amount on the sample surface during a repetition of consecutive frame scanning and scanning stop.

FIG. 12 is a diagram illustrating an example of a screen for displaying and evaluating an integration image generated by repeating the consecutive frame scanning and the scanning stop.

DESCRIPTION OF EMBODIMENTS

Figure 2A:
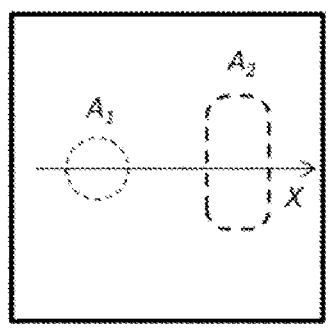
FIGS. 2A to 2E are diagrams illustrating a change in a charge amount on a sample surface during electron beam irradiation and a difference between luminance values due to a difference between charge amounts.
Figure 2B:
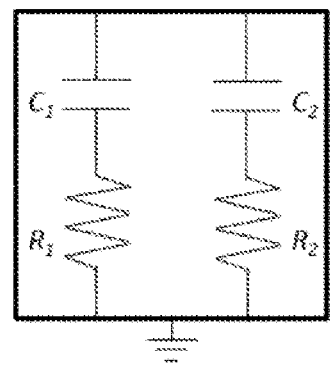

Embodiments of a charged particle beam device according to the invention will be described below with reference to the figures. The charged particle beam device is a device that irradiates a sample with a charged particle beam in which charged particles emitted from a charged particle source are focused by a lens. For example, there are various devices such as a scanning electron microscope and a transmission electron microscope that observes a sample by irradiating the sample with an electron beam, and a focused ion beam device that processes and observes a sample by irradiating the sample with a focused ion beam. Hereinafter, the scanning electron microscope (SEM) will be described as an example of the charged particle beam device.

First Embodiment

FIG. 1 illustrates an overall configuration of the scanning electron microscope. The scanning electron microscope includes a mirror unit 101, an image generation unit 102, a display unit 117, a control unit 118, and an input unit 119. Hereinafter, each component will be described.

The mirror unit 101 includes an electron gun 103, condenser lenses 105 and 106, an objective lens 107, a sample holder 109, an XY stage 108, a deflector 111, and a detector 112. The electron gun 103 emits an electron beam 104. The condenser lenses 105 and 106 and the objective lens 107 adjust an irradiation current amount, an irradiation angle, and an irradiation position of the electron beam 104. The sample holder 109 fixes a sample 110. The XY stage 108 positions the sample holder 109 in an XY plane. The deflector 111 makes the electron beam 104 scan an observation region of the sample 110. The detector 112 detects secondary electrons or reflected electrons which are emitted from the sample 110 and outputs an observation signal.

The image generation unit 102 includes an amplifier 113, an A/D converter 114, an image processing unit 116, and a frame memory 115. The amplifier 113 amplifies the observation signal output from the detector 112. The A/D converter 114 converts the amplified observation signal, which is an analog signal, into a digital signal. The image processing unit 116 is a computing unit that generates a frame image using the observation signal that is a digital signal, and integrates a plurality of frame images. The frame memory 115 stores the generated frame images.

The display unit 117 is a liquid crystal monitor or the like that displays the image generated by the image generation unit 102. The control unit 118 is a computing unit that controls the mirror unit 101 and the image generation unit 102. The input unit 119 is a keyboard, a mouse, or the like operated by an operator to input various parameters.

In the mirror unit 101, the condenser lenses 105 and 106 and the objective lens 107 adjust the beam irradiation current amount, the beam irradiation angle, and the beam irradiation position (focal point) of the electron beam 104 emitted from the electron gun 103, and a surface of the sample 110 is irradiated with the electron beam 104. The sample 110 is fixed on the sample holder 109 positioned by the XY stage 108. The sample 110 is irradiated with the electron beam to scan the observation region on a sample surface in an XY direction with the use of the deflector 111. The secondary electrons or reflected electrons emitted from the surface of the sample 110 are detected by the detector 112 and output as the observation signal.

The observation signal output from the detector 112 is amplified by the amplifier 113, and the amplified observation signal is converted from an analog signal to a digital signal by the A/D converter 114. The frame image generated by the image processing unit 116 using the observation signal converted into the digital signal is stored in the frame memory 115 and output to the display unit 117. The image processing unit 116 calculates a frame integration image, which is an image with an improved S/N by integrating a plurality of frame images, and displays the calculated image on the display unit 117. If a charged state of the sample surface changes while the frame images are being integrated, a field of view shift or a difference between luminance values is generated between the frame images used for an integration processing, and an image of the frame integration image also deteriorates.

FIG. 2 illustrates a change in the charge amount when the sample surface having a plurality of different compositions is consecutively irradiated with the electron beam and a difference between luminance values due to a difference in charge amounts. FIG. 2(a) is a schematic view of the sample surface having the plurality of different compositions, and has an A1 part and an A2 part as the parts having different compositions. FIG. 2(b) is an equivalent circuit of the A1 part and the A2 part in FIG. 2(a), and has capacitances C1 and C2 and resistances R1 and R2. The charge amount and a charge speed have characteristics according to values of the capacitance and the resistance. FIG. 2(c) is a graph of the charge amount on the sample surface in the A1 part and the A2 part consecutively irradiated with the electron beam. A horizontal axis represents time t [s], and a vertical axis represents the charge amount Q [C]. A charge amount Q2 in the A2 part saturates at a smaller charge amount faster than a charge amount Q1 in the A1 part. FIG. 2(d) and FIG. 2(e) are schematic diagrams illustrating luminance values on an image generated due to a difference between the charge amounts.

Figure 2C:
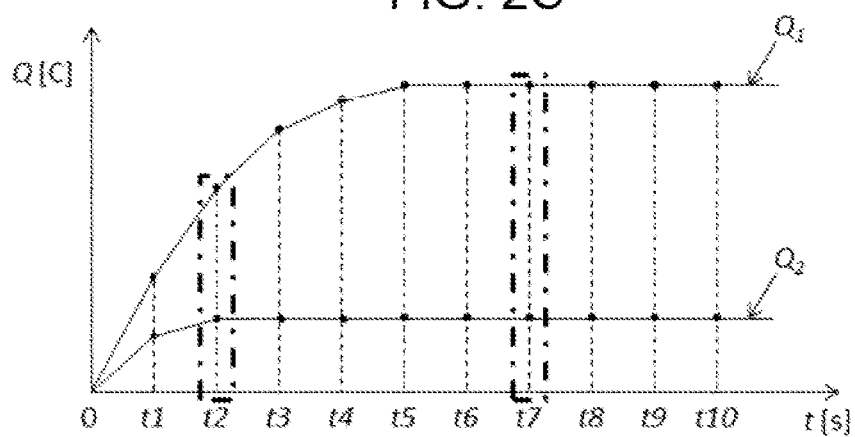
Figure 2D:
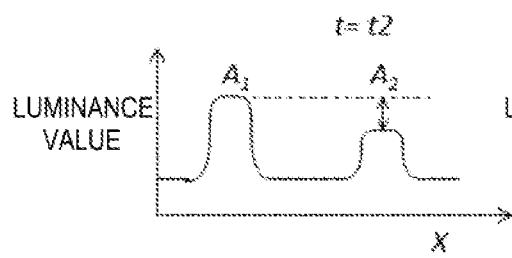
Figure 2E:
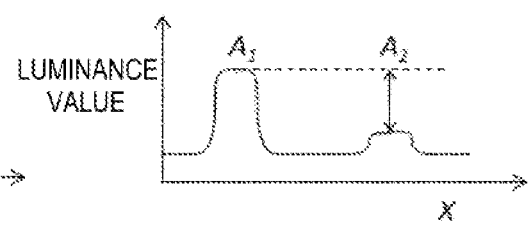

FIG. 2(d) shows a difference between luminance values at t=t2 in FIG. 2(c), and FIG. 2(e) shows a difference between luminance values at t=t7 in FIG. 2(c). If the difference between the luminance values is large, it is easy to distinguish a difference between the A1 part and the A2 part in FIG. 2(a), and if the difference between the luminance values is small, it is difficult to distinguish the difference between the A1 part and the A2 part. On the other hand, when a luminance value of the A2 part is much smaller than a luminance value of the A1 part and less than a minimum unit of the luminance value, the A2 part is buried in a peripheral part and cannot be recognized.

Therefore, it is required to appropriately control the charge amount on the sample surface according to the sample and acquire an image having a desired luminance value. According to the present embodiment, the generation of the frame image is started after a predetermined time elapses from a start of irradiation of the sample with the electron beam to control the charge amount on the sample surface.

FIG. 3 illustrates a flow of a processing according to the present embodiment, and each step will be described below.

(S301)

The operator sets observation conditions using a setting screen as shown in FIG. 4. The setting screen according to the present embodiment includes an acceleration voltage setting unit 401, a magnification setting unit 402, a scanning condition setting unit 403, and a beam irradiation time setting unit before image capture 408. The acceleration voltage setting unit 401 sets an acceleration voltage of the electron beam with which the sample 110 is irradiated. The magnification setting unit 402 sets a magnification of an observation image.

The scanning condition setting unit 403 includes a pixel time setting unit 404, an image size setting unit 405, an integration number setting unit 406, and an image generation time display unit 407. The pixel time setting unit 404 sets a pixel time, which is an electron beam irradiation time per pixel of the observation image. The image size setting unit 405 sets an image size of the observation image. The integration number setting unit 406 sets an integration number, which is the number of frame images to be integrated. The image generation time display unit 407 displays an image generation time which is a time required from the generation of the frame image to calculation of the frame integration image. The image generation time is calculated based on the pixel time, the image size, the integration number, the frame image, and the time required for the calculation of the frame integration image.

The beam irradiation time setting unit before image capture 408 sets a beam irradiation time before image capture, which is a time during which the sample 110 is irradiated with the electron beam 104 before the generation of the frame image.

The set observation conditions are transmitted to the control unit 118 and used in a subsequent processing.

(S302)

The control unit 118 controls the mirror unit 101 to start irradiating the sample 110 with the electron beam 104.

(S303)

As the control unit 118 controls the mirror unit 101 to scan the observation region of the sample 110 with the electron beam 104, frame scanning is started when the image generation unit 102 receives an observation signal output from the detector 112.

(S304)

The image generation unit 102 generates a frame image based on the observation signal received in S303. The generated frame image is stored in the frame memory 115.

(S305)

The control unit 118 determines whether the predetermined time elapses from the start of the irradiation with the electron beam 104 or whether the charge amount on the sample surface is saturated. Whether the predetermined time elapses is determined based on the beam irradiation time before image capture set in S301. Whether the charge amount is saturated is determined based on a comparison result between a generated frame image and a frame image generated in an immediately preceding frame scanning. Specifically, when a positional shift or a change in the luminance value between frame images adjacent in a time direction is smaller than a predetermined threshold value, it is determined that the charge amount is saturated. Alternatively, the operator may compare two frame images to determine whether the charge amount is saturated, and input a determination result from the input unit 119.

When the beam irradiation time before image capture does not elapse and the charge amount is not saturated, the processing returns to S303, and when the predetermined time elapses or the charge amount is saturated, the processing proceeds to S306, and shifts to an integration processing of the frame images. With the shift to the integration processing, the frame images stored in the frame memory 115 are reset.

(S306)

As the control unit 118 controls the mirror unit 101 to scan the observation region of the sample 110 with the electron beam 104, the frame scanning is started again when the image generation unit 102 receives an observation signal output from the detector 112.

(S307)

The image generation unit 102 generates a frame image based on the observation signal received in S306. The generated frame image is stored in the frame memory 115.

(S308)

The control unit 118 determines whether the generation number of frame images reaches the integration number set in S301. When the generation number does not reach the integration number, the processing returns to S306, and when the generation number reaches the integration number, the processing proceeds to S309.

(S309)

The image processing unit 116 integrates the frame images stored in the frame memory 115 to calculate a frame integration image.

(S310)

The frame integration image is displayed on the display unit 117.

According to the above processing flow, a frame integration image is calculated using the frame images generated after the predetermined time elapsed from the start of the electron beam irradiation. Alternatively, a frame integration image is calculated using the frame images generated after the charge amount on the sample surface is saturated, for example, after t=t5 for Q1 or t=t3 for Q2 in FIG. 2(c). In the frame integration image calculated in this way, a positional shift and a change in the luminance value generated by a change in the charged state can be reduced, so that the S/N can be improved.

The capacitance or resistance of the sample may be calculated using time required until the charge amount on the sample surface is saturated, and displayed. The calculated capacitance and resistance of the sample can be used for analysis of the sample.

When the sample is observed in a state before the charge amount on the sample surface is saturated, for example, in a state of t=t3 in FIG. 2(c), the operator may set the beam irradiation time before image capture to any desired time. By setting the beam irradiation time before image capture to any desired time, a desired charge amount can be controlled according to the sample.

Second Embodiment

In the first embodiment, it is described that the charge amount on the sample surface is controlled by adjusting the electron beam irradiation time before frame image capture. Since a charge on the sample surface is discharged through an atmosphere in a sample chamber or the sample holder, the charge amount on the sample surface can be controlled by adjusting a balance between an electron beam irradiation time and a suspension time. Therefore, according to the present embodiment, a description will be given in which a time during which scanning is suspended after performing the frame scanning is newly provided. Since an overall configuration of the present embodiment is the same as that of the first embodiment, the description is omitted.

FIG. 5 illustrates a flow of a processing according to the present embodiment, and each step will be described below.

(S501)

The operator sets observation conditions using a setting screen as shown in FIG. 6. The setting screen of the present embodiment includes the acceleration voltage setting unit 401, the magnification setting unit 402, and the scanning condition setting unit 403 which are similar as those in the first embodiment, and further includes a scanning suspension time setting unit 608. The acceleration voltage setting unit 401, the magnification setting unit 402, and the scanning condition setting unit 403 are the same as those in the first embodiment.

The scanning suspension time setting unit 608 sets a scanning suspension time, which is a time during which the scanning is suspended after the frame scanning is performed.

The set observation conditions are transmitted to the control unit 118 and used in a subsequent processing.

(S502)

The control unit 118 controls the mirror unit 101 to start irradiating the sample 110 with the electron beam 104.

(S503)

As the control unit 118 controls the mirror unit 101 to scan the observation region of the sample 110 with the electron beam 104, the frame scanning is started when the image generation unit 102 receives an observation signal output from the detector 112.

(S504)

The image generation unit 102 generates a frame image based on the observation signal received in S503. The generated frame image is stored in the frame memory 115.

(S505)

The control unit 118 determines whether a generation number of the frame images reaches the integration number set in S501. When the generation number does not reach the integration number, the processing returns to S503 via S506, and when the generation number reaches the integration number, the processing proceeds to S507.

(S506)

The control unit 118 controls the mirror unit 101 to suspend the scanning until the scanning suspension time set in S501 elapses. The scanning suspension is executed by not irradiating the observation region with the electron beam 104. Specifically, the scan may be suspended by any one of stopping emission of the electron beam 104 from the electron gun 103, inserting a shield between the electron gun 103 and the sample 110, deflecting the electron beam 104 to the outside of the observation region by the deflector 111, moving the XY stage 108 and the like. By not irradiating the observation region with the electron beam 104, a charge in the observation region on the sample surface is discharged through the atmosphere in the sample chamber and the sample holder 109. A discharge speed depends on a structure and composition of the sample 110.

Figure 7A:
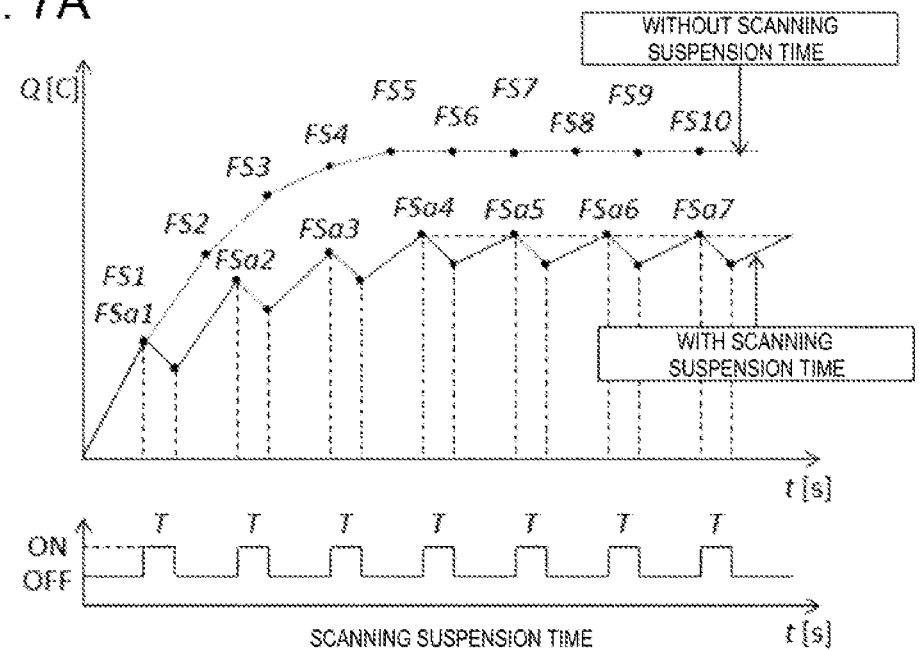
FIGS. 7A and 7B are diagrams illustrating a change in the charge amount on the sample surface during a repetition of frame scanning and scanning suspension.
Figure 7B:
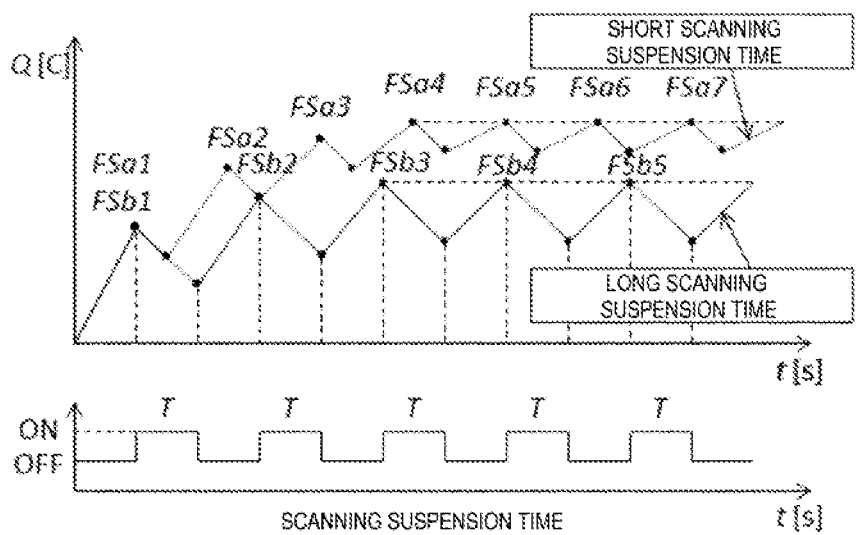

FIG. 7 illustrates a change in the charge amount on the sample surface during a repetition of the processing from S503 to S506. FIG. 7 (a) compares presence or absence of the scanning suspension, and FIG. 7(b) compares a length of the scanning suspension time. FIGS. 7(a) and 7(b) are timing charts in which in upper graphs, the horizontal axis represents time t [s] and the vertical axis represents the charge amount Q [C] on the sample surface, and lower graphs illustrate a scanning suspension time T. In FIG. 7 (a), ten times of frame scanning of FS1 to FS10 are performed when there is no scanning suspension time, and seven times of frame scanning of FSa1 to FSa7 are performed when there is a scanning suspension time. In FIG. 7(b), seven times of frame scanning of FSa1 to FSa7 are performed when the scanning suspension time is short, and five times of frame scanning of FSb1 to FSb5 are performed when the scanning suspension time is long.

As shown in FIG. 7(a), if the scanning suspension time is provided between the frame scanning, and the charge amount during the frame scanning and a discharge amount during the scanning suspension time are equal, the charge amount on the sample surface at the time of generating the frame image becomes constant and is in an equilibrium state. In FIG. 7(a), the charge amount at the time of generating the frame image is in an equilibrium state after FSa4 indicated by a dotted line in a horizontal direction.

The charge amount on the sample surface in the equilibrium state can be controlled by adjusting the scanning suspension time. As shown in FIG. 7(b), by increasing the scanning suspension time, the amount of charges discharged from the sample surface increases, and the charge amount on the sample surface in the equilibrium state can be reduced. That is, by adjusting the scanning suspension time, an image under a desired charged state can be easily acquired without changing other observation conditions such as an acceleration voltage, a magnification, and scanning conditions.

Until the charge amount on the sample surface reaches an equilibrium state, a positional shift or a change in the luminance value may be generated between frame images. In such a case, by comparing the frame images adjacent in the time direction, the positional shift or the change in the luminance value may be detected, and the detected positional shift or change in the luminance value may be corrected on each frame image.

(S507)

The image processing unit 116 integrates the frame images stored in the frame memory 115 to calculate a frame integration image. For example, when the integration number is 5, in FIG. 7 (b), five frame images generated by interposing the scanning suspension time as frame scanning of FSa1 to FSa5 or FSb1 to FSb5 are integrated.

(S508)

The frame integration image is displayed on the display unit 117.

According to the above processing flow, a frame integration image is calculated using the frame images generated with a scanning suspension time provided between the frame scanning, in other words, the frame images generated with the scanning suspension time interposed. In the frame integration image calculated in this way, the charge amount on the sample surface can be set to a desired value by adjusting the scanning suspension time, so that it is easy to acquire an observation image having a desired luminance value according to the sample.

The control unit 118 may receive an input of a target value of the charge amount on the sample surface or a luminance value of the observation image, and calculate and set the scanning suspension time according to the input target value.

Third Embodiment

In the first embodiment, it is described that the charge amount on the sample surface is controlled by adjusting the electron beam irradiation time before frame image capture. In the second embodiment, it is described that the charge amount on the sample surface is controlled by adjusting the balance between the electron beam irradiation time and the suspension time. In the present embodiment, a combination of the first embodiment and the second embodiment will be described. Since an overall configuration of the present embodiment is the same as that of the first embodiment, the description is omitted.

FIG. 8 illustrates a flow of a processing according to the present embodiment, and each step will be described below.

(S801)

The operator sets the observation conditions such as the acceleration voltage, the magnification, the scanning condition, and the scanning suspension time using the setting screen as shown in FIG. 6, similar as in the second embodiment. The set observation conditions are transmitted to the control unit 118 and used in a subsequent processing.

(S802)

The control unit 118 controls the mirror unit 101 to start irradiating the sample 110 with the electron beam 104.

(S803)

As the control unit 118 controls the mirror unit 101 to scan the observation region of the sample 110 with the electron beam 104, the frame scanning is started when the image generation unit 102 receives an observation signal output from the detector 112.

(S804)

The image generation unit 102 generates a frame image based on the observation signal received in S803. The generated frame image is stored in the frame memory 115.

(S805)

The control unit 118 determines whether the charge amount on the sample surface is saturated. Whether the charge amount is saturated is determined based on a comparison result between a generated frame image and a frame image generated in an immediately preceding frame scanning. Specifically, when a positional shift or a change in the luminance value between frame images adjacent in the time direction is smaller than the predetermined threshold value, it is determined that the charge amount is saturated. For example, when a frame image of FSa5 or FSb4 in FIG. 7 (b) is generated, the charge amount is determined to be saturated by comparing with a frame image of FSa4 or FSb3. Alternatively, the operator may compare two frame images to determine whether the charge amount is saturated, and input a determination result from the input unit 119.

When the charge amount is not saturated, the processing returns to S803 via S806, and when the charge amount is saturated, the processing proceeds to S807, and shifts to an integration processing of the frame images. With the shift to the integration processing, the frame images stored in the frame memory 115 are reset.

(S806)

The control unit 118 controls the mirror unit 101 to suspend the scanning until the scanning suspension time set in S801 elapses. The scanning suspension is executed similarly as in the second embodiment.

(S807)

As the control unit 118 controls the mirror unit 101 to scan the observation region of the sample 110 with the electron beam 104, the frame scanning is started again when the image generation unit 102 receives an observation signal output from the detector 112.

(S808)

The image generation unit 102 generates a frame image based on the observation signal received in S807. The generated frame image is stored in the frame memory 115.

(S809)

The control unit 118 determines whether the generation number of the frame images reaches the integration number set in S801. When the generation number does not reach the integration number, the processing returns to S807 via S810, and when the generation number reaches the integration number, the processing proceeds to S811.

(S810)

The control unit 118 controls the mirror unit 101 to suspend scanning until the scanning suspension time set in S801 elapses. The scanning suspension is executed similarly as in the second embodiment.

(S811)

The image processing unit 116 integrates the frame images stored in the frame memory 115 to calculate a frame integration image.

(S812)

The frame integration image is displayed on the display unit 117.

According to the above processing flow, a frame integration image is calculated using the frame images generated when the scanning suspension time is provided between the frame scanning, and the charge amount on the sample surface is in the equilibrium state. In the frame integration image calculated in this way, the charge amount on the sample surface can be set to a desired value and the positional shift and change in the luminance value generated due to the change in the charged state can be reduced, so that it is easy to acquire an observation image having a desired luminance value and high S/N.

Fourth Embodiment

In the first to third embodiments, it is described that the charge amount on the sample surface is controlled while observing the frame image. Depending on the structure and composition of the sample, it may be difficult to control the charge amount based on image observation. In such a case, the charge amount can be easily controlled by grasping a charge tendency with respect to a frame scanning time. Therefore, in the present embodiment, a description will be given of acquiring the charge tendency of the sample with respect to the frame scanning time. Since an overall configuration of the present embodiment is the same as that of the first embodiment, the description is omitted.

FIG. 9 illustrates a flow of a processing according to the present embodiment, and each step will be described below.

(S901)

The operator sets observation conditions using a setting screen as shown in FIG. 10. The setting screen of the present embodiment includes the acceleration voltage setting unit 401, the magnification setting unit 402, the scanning condition setting unit 403, and the scanning suspension time setting unit 608, similar as in the second embodiment, and further includes a number of consecutive times setting unit 1009. The acceleration voltage setting unit 401, the magnification setting unit 402, the scanning condition setting unit 403, and the scanning suspension time setting unit 608 are the same as those in the second embodiment.

The number of consecutive times setting unit 1009 sets the number of consecutive times, which is the number of times of executing the frame scanning consecutively. Hereinafter, a series of frame scanning executed for the number of consecutive times is referred to as a consecutive frame scanning.

The set observation conditions are transmitted to the control unit 118 and used in a subsequent processing.

(S902)

The control unit 118 controls the mirror unit 101 to start irradiating the sample 110 with the electron beam 104.

(S903)

As the control unit 118 controls the mirror unit 101 to scan the observation region of the sample 110 with the electron beam 104, the frame scanning is started when the image generation unit 102 receives an observation signal output from the detector 112.

(S904)

The image generation unit 102 generates a frame image based on the observation signal received in S903. The generated frame image is stored in the frame memory 115.

(S905)

The control unit 118 determines whether the generation number of frame images reaches the number of consecutive times set in S901. When the generation number does not reach the number of consecutive times, the processing returns to S903 via S906. When the generation number reaches the number of consecutive times, the processing proceeds to S907, and the number of consecutive frame scanning is counted up as one consecutive frame scanning, and a generation number of the frame images is reset.

(S906)

The control unit 118 controls the mirror unit 101 to suspend the scanning until the scanning suspension time set in S901 elapses. The scanning suspension is executed similarly as in the second embodiment.

(S907)

The control unit 118 determines whether the number of consecutive frame scanning reaches the integration number set in S901. When the number of consecutive frame scanning does not reach the integration number, the processing returns to S903 via S908, and when the number of consecutive frame scanning reaches the integration number, the processing proceeds to S909.

(S908)

The control unit 118 controls the mirror unit 101 to stop scanning until the observation region of the sample 110 is sufficiently discharged. Scanning stop is executed by not irradiating the observation region with the electron beam 104, similar as the scanning suspension.

A scanning stop time, which is a time during which the scanning is stopped in this step, is a time during which the charged state of the sample 110 is initialized, that is, a time required to reach the same state as before S902, which may be a predetermined time or may be separately set using the input unit 119.

FIG. 11 illustrates a change in the charge amount on the sample surface during a repetition of the processing from S903 to S908. The scanning suspension time is zero for simplicity. FIG. 11 is a timing chart in which in an upper graph, the horizontal axis represents time t [s] and the vertical axis represents the charge amount Q [C] on the sample surface, and a lower graph illustrate a scanning stop time Tdischarge. FIG. 11 shows an example in which the number of consecutive times is set to four times, in which four times of frame scanning of FS11 to FS14 are consecutively performed in a first consecutive frame scanning, and four times of frame scanning FS21 to FS24 are consecutively performed in a second consecutive frame scanning. As shown in FIG. 11, if a time required for the sample 110 to be sufficiently discharged, for example, a scanning stop time is provided after a consecutive frame scanning is performed, it is possible to generate frame images with the same frame scanning time (FS11 and FS21, FS12 and FS22, . . . ).

(S909)

The image processing unit 116 calculates an integration image by integrating frame images having the same frame scanning time, for example, a frame image of FS11 and a frame image of FS21, from among the frame images stored in the frame memory 115.

(S910)

The integration image calculated in S909 is displayed on the display unit 117 in association with the frame scanning time. By such display, the charge tendency of the sample with respect to the frame scanning time, in other words, the electron beam irradiation time can be grasped. As a result, it is easy to acquire an image having an optimal charged state for the operator, that is, a pixel value and a contrast desired by the operator. For example, the beam irradiation time before image capture in the first embodiment may be set based on the charge tendency of the sample with respect to the electron beam irradiation time.

FIG. 12 illustrates an example of a screen for displaying and evaluating the integration image. An evaluation of the integration image makes it easy to grasp the charge tendency with respect to the frame scanning time. The screen of FIG. 12 includes an evaluation item selection unit 1201, an integration image selection unit 1202, an evaluation value display unit 1203, a graph display unit 1204, an observation condition display unit 1205, and an integration image display unit 1206. Hereinafter, each unit will be described.

In the evaluation item selection unit 1201, an evaluation item used for evaluating each integration image is selected. In FIG. 12, as examples of the evaluation items, an average (AVE) of luminance values of the integration image, a standard deviation (STD) of luminance values, and S/N which is a ratio between AVE and STD, are displayed as selection items. The evaluation items are not limited to these, and may be, for example, a sum or a difference between the maximum value and the minimum value of the luminance values of the integration image.

In the integration image selection unit 1202, an integration image having a specific time is selected from among integration images having different frame scanning times.

In the evaluation value display unit 1203, an evaluation value calculated for an integration image selected by the integration image selection unit 1202 is displayed. The evaluation value is updated in conjunction with a selection in the evaluation item selection unit 1201 and a selection in the integration image selection unit 1202. In calculating the evaluation value, a luminance value of the entire integration image may be used, or a luminance value of a part of the integration image, for example, a luminance value of a region designated by the operator may be used.

In the graph display unit 1204, a graph for evaluating each integration image is displayed. The vertical axis of the graph is a value of the evaluation item selected in the evaluation item selection unit 1201, and the horizontal axis is the frame scanning time. In accordance with the selection in the integration image selection unit 1202, a display for identifying a specific time from the frame scanning times may be performed. For example, in FIG. 12, the display is identified by surrounding FS2 with a square.

In the observation condition display unit 1205, an acceleration voltage, a magnification, and scanning conditions are displayed as observation conditions used for generating a frame image.

In the integration image display unit 1206, a plurality of integration images is displayed in an order of the frame scanning times. In accordance with the selection in the integration image selection unit 1202, a display for identifying a specific integration image from a plurality of integration images may be performed. For example, in FIG. 12, the display is identified by surrounding an integration image of FS2 with a square.

The screen shown in FIG. 12 allows the operator to grasp the charge tendency of the sample and to quantitatively compare each integration image in the charged state by each evaluation item. Since the integration image of a desired charged state can be quickly specified, it is possible to easily acquire appropriate observation conditions and the frame scanning times according to an observation purpose. The acquired observation conditions and the like are useful for observation of a sample in which the charged state of the sample surface is important and charge-up is easy, and for observation of a voltage contrast image formed by a minute potential difference on the sample surface.

Furthermore, by comparing deviations (differential values) of the evaluation values before and after each frame for each evaluation item, the control unit 118 may specify a state where the change is the largest, that is, a state where the charge amount on the sample surface or an image quality of the observation image change the most, and present the state to the operator. By such specification and presentation, the operator can quickly specify conditions for implementing a desired charged state, and can further simplify and improve throughput in an image observation and an image evaluation involving the control of the charge amount on the sample surface.

The charged particle beam device of the invention is not limited to the above embodiments, and can be embodied by modifying the components without departing from the spirit of the invention. A plurality of components disclosed in the above embodiments may be appropriately combined. Further, some components may be deleted from all the components shown in the above embodiments.

REFERENCE SIGN LIST

101: mirror unit
102: image generation unit
103: electron gun
104: electron beam
105: condenser lens
106: condenser lens
107: objective lens
108: XY stage
109: sample holder
110: sample
111: deflector
112: detector
113: amplifier
114: A/D converter
115: frame memory
116: image processing unit
117: display unit
118: control unit
119: input unit
401: acceleration voltage setting unit
402: magnification setting unit
403: scanning condition setting unit
404: pixel time setting unit
405: image size setting unit
406: integration number setting unit
407: image generation time display unit
408: beam irradiation time setting unit before image capture
608: scanning suspension time setting unit
1009: number of consecutive times setting unit
1201: evaluation item selection unit
1202: integration image selection unit
1203: evaluation value display unit
1204: graph display unit
1205: observation condition display unit
1206: integration image display unit

The invention claimed is:

1. A charged particle beam device comprising:
a charged particle beam source configured to irradiate a sample with a charged particle beam;
a deflector configured to scan an observation region of the sample with the charged particle beam;
a detector configured to detect a charged particle emitted from the sample due to scanning with the charged particle beam;
an image generation unit configured to generate a frame image of the observation region based on an observation signal output from the detector;
a scanning suspension time setting unit configured to set a scanning suspension time, which is a time during which scanning of the observation region with the charged particle beam is suspended after a frame image is generated;
a number of consecutive times setting unit configured to set the number of consecutive times, which is the number of times to consecutively execute generation of a frame image; and
a control unit configured to execute a consecutive frame scanning for a plurality of times with a scanning stop for initializing a charged state of the sample being interposed, the consecutive frame scanning being an execution of frame scanning for the number of consecutive times;
wherein the image generation unit generates an integration image by integrating frame images having the same frame scanning time from among a plurality of frame images generated by a plurality of the consecutive frame scanning, and calculates an evaluation value of each integration image; and
wherein the image generation unit calculates a frame integration image by integrating frame images generated with the scanning suspension time interposed.

2. The charged particle beam device according to claim 1, further comprising:
a control unit configured to determine whether a charge amount of the observation region is saturated based on a comparison result between frame images adjacent in a time direction, wherein
the image generation unit calculates a frame integration image using frame images generated after the charge amount is determined to be saturated.

3. The charged particle beam device according to claim 1, further comprising:
an input unit configured to input a target value of a charge amount of the sample or a luminance value of the frame integration image; and
a control unit configured to calculate the scanning suspension time according to the target value, and control the scanning suspension time setting unit to set the calculated scanning suspension time.

4. The charged particle beam device according to claim 1, wherein
a graph in which the evaluation value is in association with the frame scanning time is displayed.

5. The charged particle beam device according to claim 4, wherein
a point at which a change in the evaluation value is largest is displayed in the graph.

6. The charged particle beam device according to claim 1, wherein
the integration image is displayed in parallel in association with the frame scanning time.

7. The charged particle beam device according to claim 1, wherein
the evaluation value is any one of an average value, and a standard deviation of luminance values of the integration image, and a ratio between the average value and the standard deviation.

8. A charged particle beam device comprising:
a charged particle beam source configured to generate a charged particle beam;
a deflector configured to scan an observation region of a sample with the charged particle beam;
a detector configured to detect a charged particle emitted from the sample due to scanning with the charged particle beam;
an image generation unit configured to generate a frame image of the observation region based on an observation signal output from the detector; and
a time setting unit configured to set a predetermined time;
a number of consecutive times setting unit configured to set the number of consecutive times, which is the number of times to consecutively execute generation of a frame image; and
a control unit configured to execute a consecutive frame scanning for a plurality of times with a scanning stop for initializing a charged state of the sample being interposed, the consecutive frame scanning being an execution of frame scanning for the number of times equivalent to the consecutive times;
wherein the image generation unit generates an integration image by integrating frame images having the same frame scanning time from among a plurality of frame images generated by a plurality of the consecutive frame scanning, and calculates an evaluation value of each integration image; and
wherein the image generation unit calculates a frame integration image by integrating frame images generated after the predetermined time elapsed from a start of the scanning with the charged particle beam.

9. The charged particle beam device according to claim 8, wherein
the time setting unit sets the predetermined time based on a comparison result between frame images adjacent in a time direction.

10. The charged particle beam device according to claim 8, wherein
the time setting unit sets a value input by an input unit as the predetermined time.

* * * * *